US012567690B2

(12) United States Patent
Schaper et al.

(10) Patent No.: US 12,567,690 B2
(45) Date of Patent: Mar. 3, 2026

(54) APPARATUS FOR PROCESSING SIGNALS BETWEEN A CONTROLLER AND FIELD DEVICES

(71) Applicant: Phoenix Contact GmbH & Co. KG, Blomberg (DE)

(72) Inventors: Elmar Schaper, Luegde (DE); Carsten Thoerner, Melle (DE); Christoph Leifer, Bad Driburg (DE); Felix Schulte, Geseke (DE); Benjamin Klimmek, Aerzen (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 760 days.

(21) Appl. No.: 17/791,567

(22) PCT Filed: Jan. 13, 2021

(86) PCT No.: PCT/EP2021/050539
§ 371 (c)(1),
(2) Date: Jan. 24, 2023

(87) PCT Pub. No.: WO2021/144290
PCT Pub. Date: Jul. 22, 2021

(65) Prior Publication Data
US 2023/0299522 A1 Sep. 21, 2023

(30) Foreign Application Priority Data

Jan. 17, 2020 (DE) .................... 10 2020 101 085.0

(51) Int. Cl.
*H01R 12/91* (2011.01)
*H01R 12/72* (2011.01)
(Continued)

(52) U.S. Cl.
CPC ........... *H01R 12/91* (2013.01); *H01R 12/721* (2013.01); *H01R 12/737* (2013.01); *H05K 7/1468* (2013.01); *H05K 7/1477* (2013.01)

(58) Field of Classification Search
CPC .... H01R 12/718; H01R 12/91; H05K 7/1477; H05K 7/1474
See application file for complete search history.

(56) References Cited

U.S. PATENT DOCUMENTS 2,871,457 A * 1/1959 Jencks ................. H05K 7/1407
361/725
7,216,191 B2 * 5/2007 Sagues ................. G05B 19/054
710/316
(Continued)

FOREIGN PATENT DOCUMENTS

CN 107690735 A 2/2018
DE 102015002389 A1 8/2016
(Continued)

*Primary Examiner* — Marcus E Harcum
(74) *Attorney, Agent, or Firm* — LEYDIG, VOIT & MAYER, LTD.

(57) ABSTRACT

An apparatus for processing signals transmitted between a controller and one field device or multiple field devices includes: a carrier having a control interface, a field interface, and one slot or multiple slots, the control interface being for connection of one electrical line channel or multiple electrical line channels of the controller, the field interface being for connection of input and/or output signal lines, I/O signal lines, of the one field device or the multiple field devices, and the one slot is, or each of the multiple slots are, for the releasable mechanical connection of a module in a plug-in direction and, in the mechanically connected state, for the electrical connection of the respective module to the line channel or one of the line channels and to the I/O signal lines of the field device or one of the field devices; and at least one module.

20 Claims, 6 Drawing Sheets

(51) Int. Cl.
    *H01R 12/73*       (2011.01)
    *H05K 7/14*        (2006.01)

(56)          References Cited

U.S. PATENT DOCUMENTS

| | | | | |
|---|---|---|---|---|
| 7,435,098 | B2 * | 10/2008 | Yi | H01R 12/716 |
| | | | | 439/67 |
| 7,476,802 | B2 * | 1/2009 | Cane | H05K 7/1474 |
| | | | | 174/59 |
| 9,362,641 | B2 * | 6/2016 | Bachmutsky | H01R 12/737 |
| 9,436,233 | B2 * | 9/2016 | Correll | G06F 1/184 |
| 9,971,727 | B2 | 5/2018 | Brodbeck et al. | |
| 10,038,281 | B2 * | 7/2018 | Wig | H01R 13/6471 |
| 10,368,458 | B2 * | 7/2019 | Mielnik | H05K 5/0017 |
| 10,403,992 | B1 * | 9/2019 | Mason | H01R 13/2442 |
| 2004/0024939 | A1 | 2/2004 | Hoeing et al. | |

| | | | | |
|---|---|---|---|---|
| 2005/0101188 | A1 * | 5/2005 | Benham | H01R 13/6474 |
| | | | | 439/620.01 |
| 2007/0184676 | A1 * | 8/2007 | Minich | H01R 12/714 |
| | | | | 439/65 |
| 2010/0173531 | A1 * | 7/2010 | Holste | H01R 4/4821 |
| | | | | 439/700 |
| 2017/0155203 | A1 * | 6/2017 | Goto | H05K 1/184 |
| 2017/0346205 | A1 | 11/2017 | Eriksson | |
| 2018/0145485 | A1 | 5/2018 | Fischer et al. | |
| 2019/0052001 | A1 * | 2/2019 | Consoli | H01R 12/737 |
| 2020/0272119 | A1 * | 8/2020 | Mielnik | G05B 15/02 |

FOREIGN PATENT DOCUMENTS

| | | | |
|---|---|---|---|
| EP | 1058351 | A2 | 12/2000 |
| EP | 1383368 | A2 | 1/2004 |
| EP | 3149550 | B1 | 4/2017 |

* cited by examiner

114

APPARATUS FOR PROCESSING SIGNALS BETWEEN A CONTROLLER AND FIELD DEVICES

CROSS-REFERENCE TO PRIOR APPLICATIONS

This application is a U.S. National Phase application under 35 U.S.C. § 371 of International Application No. PCT/EP2021/050539, filed on Jan. 13, 2021, and claims benefit to German Patent Application No. DE 10 2020 101 085.0, filed on Jan. 17, 2020. The International Application was published in German on Jul. 22, 2021 as WO/2021/144290 under PCT Article 21 (2).

FIELD

The invention relates to an apparatus for processing signals transmitted between a controller and one or several field devices.

BACKGROUND

Controllers, in particular programmable logic controllers (PLC), can optionally be connected via logic units to signal processing modules in order to detect or output a large variety of signal forms on the field side. This is also referred to as signal conditioning or, in technical terms, more generally as "marshalling". The document U.S. Pat. No. 9,971,727 B2 describes an interposer system for processing input and/or output signals, which are transmitted between a field device and a controller. The system comprises a carrier, onto which the signal processing modules, including a signal processing circuit, are plugged. The carrier comprises a field-side terminal as well as a control-side terminal.

In the case of conventional interposer systems, however, a complex plug-in connector half, which provides for the necessary electrical and mechanical connection at the edge of the module leading in the plug-in direction, is necessary at each slot, into which a module can be plugged. Each module has to also comprise a correspondingly complex complementary plug-in connector half for the mechanical and electrical connection.

SUMMARY

In an embodiment, the present invention provides an apparatus for processing signals transmitted between a controller and one field device or multiple field devices, comprising: a carrier, which comprises a control interface, a field interface, and one slot or multiple slots, the control interface being configured for connection of one electrical line channel or multiple electrical line channels of the controller, the field interface being configured for connection of input and/or output signal lines, I/O signal lines, of the one field device or the multiple field devices, and the one slot is, or each of the multiple slots are, configured for releasable mechanical connection of a module in a plug-in direction and, in the mechanically connected state, for the electrical connection of the respective module to the line channel or one of the line channels and to the I/O signal lines of the field device or one of the field devices; and at least one module, which is configured for the releasable mechanical connection to the carrier at the slot or one of the slots, and which is configured, in the mechanically connected state, to process signals from the electrically connected line channel and to output the signals at the electrically connected I/O signal lines and/or to process signals from the electrically connected I/O signal lines and to output the signals at the electrically connected line channel, wherein, in the mechanically connected state, the respective slot electrically connects the module at a first point of the module and, at the first point, has a mechanical degree of freedom transverse to the plug-in direction between module and carrier, and wherein the mechanical degree of freedom of the first point is determined by the mechanical connection of the slot at a second point of the module, which second point is different from the first point.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
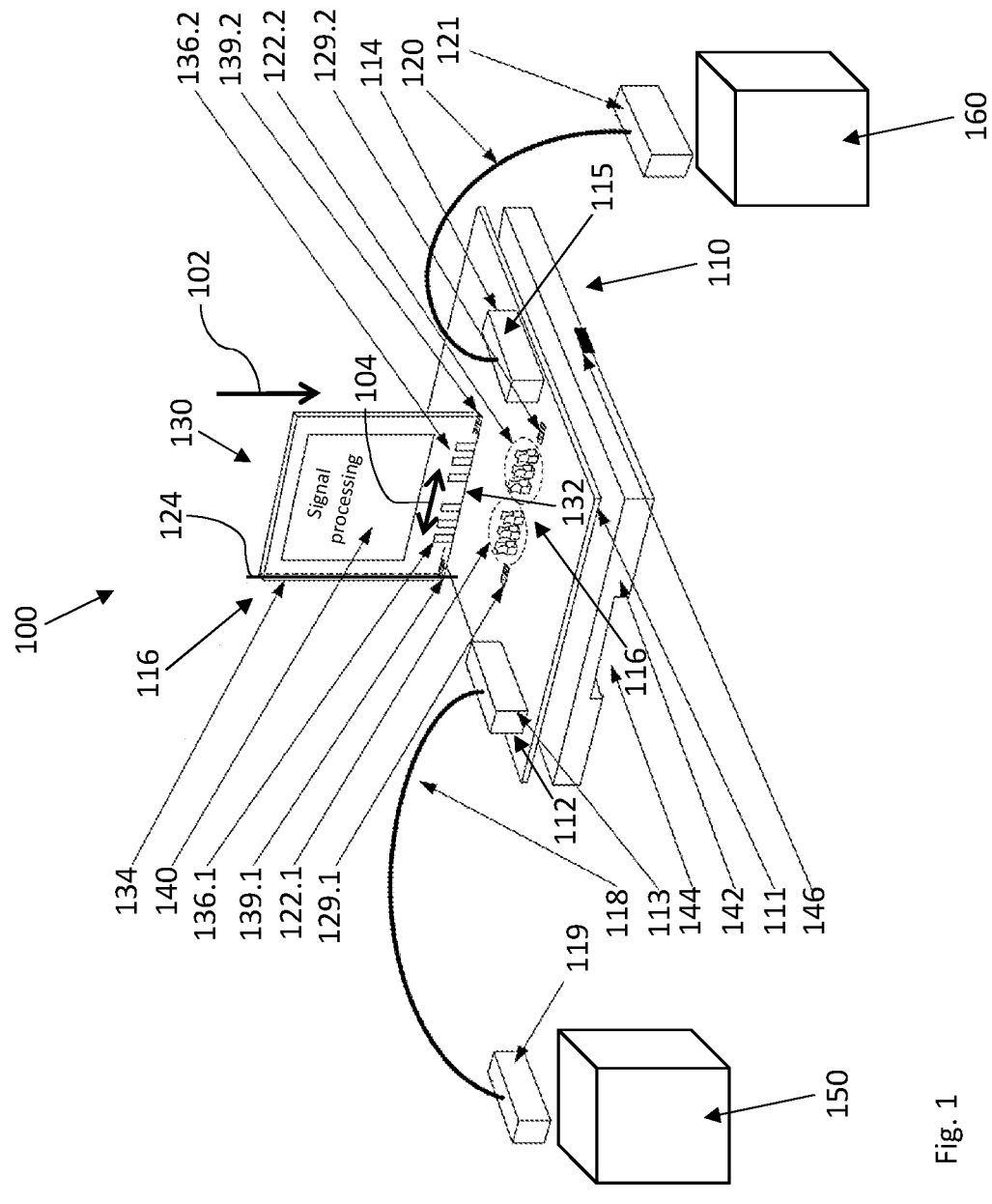
FIG. 1 shows a schematic perspective view of an apparatus for processing signals transmitted between a controller and at least one field device according to a first exemplary embodiment.

In an embodiment, the present invention provides a technique for the processing of a signal between field devices and at least one controller, which enables producing the carrier and the modules more easily. In an embodiment, the modules are of flatter construction and can be arranged more densely on the carrier.

Exemplary embodiments of the invention are described below with partial reference to the drawings.

According to one aspect, an apparatus for processing signals transmitted between a controller and one or several field devices comprises a carrier and at least one module.

The carrier comprises a control interface, a field interface, and a slot or several slots. The control interface is configured for the connection of one or several electrical line channels of the controller. The field interface is configured for the connection of input and/or output signal lines (I/O signal lines, or in short: signal lines) of the one field device or of the several field devices. The one slot or the several slots are each configured for the releasable mechanical connection of a module in a plug-in direction and, in the mechanically connected state, for the electrical connection of the respective module to the or one of the line channels and to the I/O signal lines of the or of one of the field devices.

The at least one module is configured for the releasable mechanical connection to the carrier at the slot or one of the slots. The at least one module is further configured, in the mechanically connected state, to process signals from the electrically connected line channel and to output them at the electrically connected I/O signal lines and/or to process signals from the electrically connected I/O signal lines and to output them at the electrically connected line channel. The slot, or each slot in each case, is configured to electrically connect the module at a first point and, at or on the first point, has a mechanical degree of freedom transverse to the plug-in direction between module and carrier. The mechanical degree of freedom of the first point is determined (or fixed) by the mechanical connection at a second point of the module, which second point differs from the first point.

In the case of exemplary embodiments of the apparatus, the electrical connection at the first point can be constructed in a simplified manner (for example compared to the mentioned prior art) due to the second point for determining the mechanical degree of freedom, which second point differs from the first point for the electrical connection. For example, exemplary embodiments of the carrier and/or of the modules can forgo a plug-in connector half at the first point and/or can be produced more cost-efficiently. Alternatively or additionally, exemplary embodiments of the carrier and/or of the modules can have more slots and/or can have slots that are spaced apart more tightly from one another and/or that can be constructed more compactly. For example, a density of the slots at the carrier can be increased (i.e., a distance between the slots can be shortened) and/or the at least one module can in each case be constructed to be flatter.

For the electrical connection of the respective module, the slot of the carrier can comprise electrical contacts (preferably spring contacts, for example spring clamps). A positioning and/or an assignment of these electrical contacts can optionally be configured according to the document U.S. Pat. No. 9,971,727 B2, wherein (for example deviating from the mentioned prior art) the electrical contacts have the mechanical degree of freedom transverse to the plug-in direction and/or are configured to provide for the mechanical degree of freedom transverse to the plug-in direction. For example, the slot or each slot in each case comprises a frameless row of spring contacts (for example spring clamps).

Alternatively or additionally, the module or each module can comprise electrical conductor tracks (or circuit paths or traces) at the first point for the electrical connection to the line channel and the I/O signal lines of the respective module. A positioning and/or an assignment of these electrical conductor tracks can optionally be configured according to the document U.S. Pat. No. 9,971,727 B2, wherein (for example deviating from the mentioned prior art) the electrical conductor tracks have the mechanical degree of freedom transverse to the plug-in direction and/or are configured to provide for the mechanical degree of freedom transverse to the plug-in direction.

The I/O signal lines can also be referred to as input and/or output signal lines, as I/O signal lines, or, in short, as signal lines. The mechanical degree of freedom can also be referred to in short as degree of freedom.

The processing of the signals can be referred to as signal processing. The module or the modules can in each case be configured for the signal processing (also referred to as signal-processing modules). Exemplary embodiments of the (preferably signal-processing) module or of the modules can initially be arranged or can be capable of being arranged at the slot or one of the slots of the carrier.

Exemplary embodiments can provide for a change of the module or of individual modules at the carrier, for example independently of one another and/or during operation of the controller, of the apparatus and/or of the other modules. Due to the mechanical connection at the second point, an individual module can be removed or mechanically released reliably from the slot independently of the other modules, for example without inadvertently removing or mechanically releasing an adjacent module.

Due to the change of individual modules, a defect of the signal processing can be eliminated or an adaptation of the signal processing can be made possible, for example without disconnecting a terminal for the electrical connection to the field device or the field devices (i.e. the field interfaces for the connection of the I/O signal lines of the field devices) and/or a terminal for the electrical connection to the controller (i.e. the control interface for the connection of the line channels).

For example, the module can be mechanically releasable and/or unlockable and/or removable (preferably directly) for removal from the slot, for example at the second point and/or at an end of the module located opposite the first point and/or between the second point and the end. Alternatively or additionally, the mechanical connection between slot and module at the second point can be configured to determine the mechanical degree of freedom transverse to the plug-in direction, preferably while the electrical connection of the module at the first point is released. It may be thus possible to prevent a faulty or damaging electrical connection or a short-circuit during the removal.

A connecting or electrical connecting of the module during the mechanical connection or the insertion of the module and/or a disconnecting of the electrical connection of the module when releasing the mechanical connection of the module can comprise a connecting or disconnecting, respectively, of the signal lines (for example between the slot and the first point) for the respective module and/or a connecting or disconnecting, respectively, of the line channel or of the line channels (for example between slot and the first point) for the respective module.

In the mechanically connected state, the modules can be configured to establish a (preferably bidirectional) communication channel with the controller via the respective line channel.

The controller can be a (for example industrial) process controller. The carrier can also be referred to as carrier board or interposer. The field devices can comprise sensors and/or actuators.

Exemplary embodiments can provide for a simple adaptation of the module or of one of the modules on the carrier. Alternatively or additionally, a variable terminal of the respective field device can be made possible at any line channel of the controller. By changing an individual module, the respective signal processing can comprise, for example, a function and/or signal form, which is specific for the respective field device.

Each interface mentioned herein can be realized by means of a clamp or a plug-in connector half, for example a socket, a plug, or a hermaphroditic plug-in connector half. For example, the field interface can comprise a plug-in connection and/or a terminal connection.

An assignment of the field interface and/or of the electrical connection between slot of the carrier and first point of the module may comprise contacts, which are connected or can be connected (i.e. are connectable) to I/O signal lines, for example for a temperature sensor (for example a resistance sensor or, in technical terms, "resistance temperature detector", respectively, or "RTD"; and/or a conductor with positive temperature coefficient or, in technical terms "PTC", respectively; and/or a conductor with negative temperature coefficient or, in technical terms "NTC", respectively); a digital or binary output (for example for logic level, preferably according to "transistor-transistor logic" or TTL); and/or a digital or binary input (for example for logic level, preferably according to "transistor-transistor logic" or TTL); and/or a direct current supply and/or an electrical ground potential (for example functional grounding or a protective grounding).

The first point of the module can be spaced apart from the second point of the module. The first and/or the second point can be points of a circuit board of the module or points of a module housing, for example in which the module or a signal processing unit is arranged. Insofar as reference is made herein to the first or second point in connection with the carrier, for example the slot, a point at the carrier, for example at the slot, which corresponds to the first or second point, respectively (preferably in the mechanically connected state) can be disclosed or determined therewith.

A first edge of the module or of the module housing, preferably an edge of the module or of the module housing, which leads in the plug-in direction, may comprise the first point of the module. The first edge of the module or of the module housing may be transverse, preferably perpendicular, to the plug-in direction and/or parallel to the direction of the mechanical degree of freedom.

A second edge of the module or of the module housing, which may be different from the first edge, may comprise the second point of the module. The second edge of the module may be parallel to the plug-in direction and/or transverse, preferably perpendicular, to the direction of the mechanical degree of freedom.

The first point of the module can comprise (for example non-insulated or exposed) conductor tracks. The conductor tracks can be arranged and/or configured for transmitting the signals from or to the electrically connected line channel or the electrically connected line channels. Alternatively or additionally, the conductor tracks can be arranged and/or configured for transmitting the signals from the or to the electrically connected I/O signal lines.

The slot, or each slot in each case, may comprise spring contacts for the electrical connection. The spring contacts may be arranged in a row parallel to the direction of the degree of freedom. Alternatively or additionally, the spring contacts may be two-sided spring contacts or tulip contacts for contacting the conductor tracks and/or spring contacts for transmitting the signals from or to the electrically connected line channel and/or spring contacts for transmitting the signals from the or to the electrically connected I/O signal lines.

The two-sided spring contacts or tulip contacts may be in alignment with the degree of freedom. Alternatively or additionally, the two-sided spring contacts or tulip contacts may be open in the direction of the degree of freedom.

At the first point of the module, contact springs may cantilever or protrude from the module, for example in the plug-in direction. The contact springs may be arranged and/or configured for the electrical connection of the respective line channel, for example for the contacting of contacts on the side of the carrier, on which the respective line channel abuts. Alternatively or additionally, the contact springs may be configured for the electrical connection of the respective I/O signal lines.

For the electrical connection (for example to the module), the respective slot can comprise circular holes or oblong holes. For example, the circular holes or the oblong holes can be arranged in a row parallel to the direction of the mechanical degree of freedom. Alternatively or additionally, the oblong holes may be aligned parallel to the direction of the mechanical degree of freedom.

Each of the circular holes or each of the oblong holes can have a contact surface revolving on the edge of the circular hole or of the oblong hole, respectively, for contacting the contact springs.

At the first point, at least one electrode can be arranged at the module to capacitively couple with a functional grounding of the carrier in the mechanically connected state. For example, at least two electrodes can be arranged at the first point for the functional grounding of a respective control-side interface and of a field-side interface of the module.

The respective slot can comprise at least one grounded electrode. The grounded electrode can be arranged to capacitively couple with the module in the mechanically connected state. At least two grounded electrodes can be arranged parallel to or along the direction of the degree of freedom.

For example, at least two electrodes at the module and at least two electrodes at the slot are arranged for the pairwise capacitive coupling in the mechanically connected state. A first pair comprising a first electrode of the module and a first electrode of the slot attains a grounding on the control side. A second pair comprising a second electrode of the module and a second electrode of the slot attains a grounding on the field side.

The module can comprise electrodes for the capacitive coupling with the grounded electrodes at the slot. The electrodes for the capacitive coupling at the module can have an insulating layer (for example a varnish layer). Alternatively or additionally, the electrodes for the capacitive coupling at the module can in each case be an end of a conductor track (insulated by means of the layer and/or exposed) or a contact surface. The electrodes for the (for example capacitive or galvanic, i.e. direct) coupling at the slot can comprise tulip contacts or contact surfaces.

An electric strength of the capacitive coupling can be determined by a dielectric strength (for example according to series of standards IEC 60243) of the capacitive coupling. The electric strength can in particular be determined by at least one of the following parameters: varnish layer thickness (for example of the varnish layer at the end of the conductor track), an electron work function of a varnish material (for example of the varnish layer at the end of the conductor track), and a chemical binding energy of the varnish material (for example of the varnish layer at the end of the conductor track). The capacitive coupling by means of a two-sided spring contact can correspond to a parallel connection of two different capacitances, whereby the capacitances of each side add up.

The module can comprise a signal processing unit. The signal processing unit can be configured to process the signals from the electrically connected line channel and to output them at the electrically connected I/O signal lines and/or to process the signals from the electrically connected I/O signal lines and to output them at the electrically connected line channel. The module can further comprise a circuit board (also board), which carries the signal processing unit and which comprises a plurality of conductor tracks contacting the signal processing unit. The first point can comprise a first edge (for example the edge, which leads in the plug-in direction) of the board, at which the conductor tracks end.

The control interface of the carrier can comprise a plug-in connector half, preferably a socket or a plug, which is configured for the connection of the electrical line channel or channels of the controller. All line channels can be capable of being connected by means of a single plug-in connector half of the carrier and/or on the carrier. The plug-in connector half can be configured for the plug-in connection with a complementary plug-in connector half. The complementary plug-in connector half can comprise at least two line channels in a mechanically cohesive manner.

The carrier can be configured for the pass-through of different line channels of the controller at different slots. The pass-through of the line channels can be a 1-to-1 connection from the control interface or the controller to the slot or module. The carrier can be configured for the pass-through of a respective one of the line channels of the control interface at each of the slots. The carrier can be configured for the pass-through of exactly one of at least two electrical line channels one-to-one at a respective one of the slots.

Alternatively or additionally, the field interface can comprise a plug-in connector half, preferably a socket or a plug, for the connection of the signal lines of the field device or devices.

The carrier can be configured for the pass-through of different signal lines of the field devices at different slots. The pass-through of the signal lines can be a 1-to-1 connection from the field interface or the field devices to the slot or module. The carrier can be configured for the pass-through of a respective signal line of the controller at each of the slots. The carrier can be configured for the pass-through of exactly one of at least two signal lines one-to-one at a respective one of the slots.

The controller can be a (for example industrial) process controller. The carrier can also be referred to as carrier board or interposer. The field devices can comprise sensors and/or actuators.

Each (for example field and/or control) interface mentioned herein can be realized by means of one or several clamps or one or several plug-in connector halves, for example a socket, a plug, or a hermaphroditic plug-in connector half.

The carrier may be a common carrier (for example comprising a one-piece board) for at least two slots. The carrier may have a back-wiring (in technical terms also: backplane) for the pass-through of the at least one of the line channels and/or of the signal lines to the respective module. For example, the respective spring contact or the respective circumferential contact surface (of the circular holes or of the oblong holes) can be electrically conductively connected to the back-wiring.

At the first point, the or each module can in each case comprise one or several conductor tracks for the electrical connection to the signal lines of the respective field device and/or one or several conductor tracks for the electrical connection to the or one of the line channels.

The apparatus may further comprise the signal lines of the field device or of the several field devices. The signal lines may comprise a (preferably mechanically cohesive or single piece) plug-in connector half. The plug-in connector half of the signal lines can be releasably connected or connectable to the field interface of the carrier for the connection of the signal lines and/or for the pass-through of the respective at least one signal line of the respective field device to the respective module via the electrical connection between the respective slot and the first point of the respective module.

The slot of the carrier can preferably comprise a mechanical interface for the mechanical connection, for example locking, to the respective module at the second point. Alternatively or additionally, each module or a module housing of the respective module can comprise a mechanical interface for the mechanical connection, for example locking, to the carrier at the second point of the respective module.

The carrier can be configured for the pass-through of different line channels of the controller at different slots. The pass-through of the line channels can be a 1-to-1 connection from the controller via the control interface and the respective slot to the module. The pass-through can comprise a back-wiring or so-called "backplane" on the carrier.

The carrier can comprise several slots. The carrier can be configured for the pass-through of a respective one of the line channels of the controller at each of the slots. The control interface of the carrier can be configured for the connection of several line channels of the controller. The carrier can be configured for the pass-through of exactly one of the at least two electrical line channels one-to-one at a respective one of the slots.

The carrier may be configured to pass-through the line channels to the respective module without an own (or separate) signal processing and/or with a linear signal response via the electrical connection between slot and first point of the module. The carrier may be configured to provide the line channels to the module or the individual modules without own (or separate) and/or non-linear signal processing or without a data process via the electrical connection between the respective slot and the first point of the respective module.

The line channels passed through to the respective module may comprise a (preferably serial and/or digital) communication between the controller and the module. The carrier may be configured to pass-through the communication to the individual modules without own (or separate) signal processing and/or own (or separate) data processing.

The module, or the modules in each case, may be configured to be in signal line connection with at least one of the field devices by means of the signal lines. Each field device may be in signal line connection with an assigned module via separate signal lines. The signal line connection may comprise input signals from the respective field device and/or output signals to the respective field device. The signal line may comprise a wiring (for example conductor tracks) from the electrical connection at the respective slot to the field interface.

The sensors may output measurement signals, analysis signals and/or alarm signals to the respective module by means of the signal line. The respective module may acquire (or detect) the (for example measured) signals and may output them as data to the controller via the respective line channel.

Alternatively or additionally, the actuators may comprise switches and/or control elements. The respective module may receive control signals from the controller via the passed-through line channel and may output corresponding (for example actuator-specific) control signals to the actuator via the I/O signal lines. For example, the modules may send measurement data to the controller via the respective line channels based on the signals of the field devices, preferably continuously (for example periodically or in certain time intervals) or in a result-driven manner (for example in response to a query statement from the controller). Alternatively or additionally, the modules may receive control data for the respective actuators via the respective line channels. The modules preferably do not directly exchange the detected signals with one another, but send them to the controller, for example for exchanging the detected signals on an application plane or process plane of the controller.

Each electrical connection mentioned herein may be an electrically conductive connection, preferably a galvanic or ohmic connection.

The carrier may comprise at least two slots. The at least two slots of the carrier may be configured to mechanically connect and/or to release at least two modules independently of one another to the carrier. The module, or one or each of the modules, may be configured for being inserted into each of the slots of the carrier, for example may be mechanically and electrically connectable to the carrier at each of the slots.

In their respective slot, the modules can be individually accessible, individually connectable (for example individually insertable and/or individually lockable) and/or individually releasable. In spatial assignment to the second point of the respective module, each slot can comprise, for example, a (preferably independent) locking mechanism and/or a (preferably independent) longitudinal guide for the releasable mechanical connection to one of the modules. Alternatively or additionally, the at least two modules can be adjacent to one another and/or can be inserted into adjacent slots of the module. For example, at least two modules can be capable of being inserted simultaneously (i.e. en bloc) into their respective slots.

The module, or at least one or each of the modules, may comprise a signal processing unit, which is configured to acquire (or to detect, also: to receive), to process and/or to output (also to send) the signals.

The signal processing unit of the respective module may be connected or connectable to the controller by means of the electrical connection between the respective slot of the carrier and the first point of the respective module and/or by means of a pass-through of the respective line channel on the carrier between the control interface and the respective slot. Alternatively or additionally, the signal processing unit of the respective module may be connected or connectable to the respective field device by means of the electrical connection between the respective slot of the carrier and the first point of the respective module and/or by means of a pass-through of the respective signal lines on the carrier between the field interface and the electrical connection at the slot.

The module or each module, preferably the respective signal processing unit, may be configured to provide functions on a field plane, on a physical plane and/or on the lowermost plane in a protocol stack or hierarchical plane model (e.g. in the OSI layer model) of a field bus (for example in the automation or the production technique). Alternatively or additionally, the module or each module, preferably the respective signal processing unit, may comprise a signal amplifier, an analog-to-digital converter, a digital-to-analog converter, a galvanic separation (for example an optocoupler) and/or a solid state relay (for example for switching a circuit in accordance with a logical control signal from the controller).

The or each module can comprise a separate module housing. The module housing can be made of a dielectric material, for example of plastic. The respective signal processing unit can preferably be arranged and/or implemented in the respective module housing.

The apparatus may further comprise an apparatus housing. The carrier may be arranged in the apparatus housing. When connected to the carrier, the module or the modules can be arranged or can be arrangeable in the carrier.

FIG. 1 shows a schematic perspective view of a first exemplary embodiment of an apparatus, which is generally identified with reference numeral 100, for processing signals transmitted between a controller 150 and one or several field devices 160.

The apparatus 100 comprises a carrier 110 (for example a conductor plate 111), which comprises a control interface 112, a field interface 114, and one or several slots 116. The control interface 112 is configured for the connection 113 of one or several electrical line channels 118 of the controller 150. The field interface 114 is configured for the connection 115 of input and/or output signal lines 120 (in short: I/O signal lines or signal lines) of the one or of the several field devices 160.

The one slot 116 is, or the several slots 116 are in each case, configured for the releasable mechanical connection of a module 130 in a plug-in direction 102. In the mechanically connected state (between slot 116 and respective module 130), the or each slot 116, respectively, is configured for the electrical connection of the respective module 130 to the or all or one of the line channels 118 of the controller 150 and for the electrical connection of the respective module 130 to the I/O signal lines 120 of the or of one of the field devices 160.

The apparatus 100 further comprises at least one module 130, which is configured for the releasable mechanical connection to the carrier 110 at the or (at least) one of the slots 116 of the carrier 110. In the mechanically connected state, the at least one module 130 (for example a signal processing unit 140 of the module 130) is configured to process signals from the line channel 118 (which is preferably electrically connected via the slot 116 and the control interface 112). The at least one module 130 (for example the signal processing unit 140 of the module 130) is further configured to output the processed signals at the I/O signal lines 120 (which are preferably electrically connected via the slot 116 and the field interface 114). Alternatively or additionally, the at least one module 130 (for example the signal processing unit 140 or a further signal processing unit of the module 130) is configured to process signals from the I/O signal lines 120 (which are preferably electrically connected via the slot 116 and the field interface 114). Further, the at least one module 130 (for example the signal processing unit 140 or the further signal processing unit of the module 130) is configured to output the processed signals at the line channel 118 (which is preferably electrically connected via the slot 116 and the control interface 112).

In the mechanically connected state, the or each slot 116 is configured to electrically connect (i.e. to contact) the module 130 at a first point 132 of the module 130. At the first point 132, the or each slot 116 has a mechanical degree of freedom 104 transverse to the plug-in direction 102 between module 130 and carrier 110. The mechanical connection of the slot 116 is further configured to determine the mechanical degree of freedom 104 of the first point 132 at a second point 134 of the module 130 which differs and/or which is spaced apart from the first point 132.

The determination (or fixation) of the mechanical degree of freedom 104 is generally referred to with reference numeral 124. The determination 124 (or fixation 124) may be realized, for example, by means of at least bearing (preferably at least one guide rail). The bearing 124 may be a floating bearing or a sliding bearing with respect to the plug-in direction 102, for example a guide rail 124 extending in the plug-in direction 102.

The determination 124 of the mechanical degree of freedom at the first point 132 may comprise a guide rail of the carrier 110. The guide rail 124 may extend along the plug-in direction 102. The guide rail 124 may comprise a groove (for example a rectangular groove), which is open in the direction of the module 130 and/or in the transverse direction and in which the module (for example a circuit board of the module) is guided in a longitudinally movable manner in the plug-in direction 102. The mechanical degree of freedom of the first point 132 may be realized by applying the module 130 to a groove base of the groove in the guide rail.

The groove in the guide rail 124 can comprise two parallel groove flanks, between which the module (for example the circuit board of the module) is guided in a longitudinally movable manner. In the guide rail 24, at least one groove flank or both groove flanks of the groove optionally comprises a cantilever, which tapers a groove width of the groove. At the second point 134, the module 130 can have a recess, which is complementary to the cantilever, for example a further groove in the surface of the module 130. The cantilever can be configured to cooperate positively with the recess for the purpose of determining the mechanical degree of freedom.

While the carrier 110 in the first exemplary embodiment comprises a guide rail 124 at the second point 134, a second point 134 for determining the mechanical degree of freedom can in each case be realized on opposite edges of the module 130 in a variation of each exemplary embodiment. The carrier 110 can comprise, for example, two guide rails 124, which extend in the plug-in direction 102 and in which the module 130 is guided in a longitudinally movable manner in the plug-in direction Alternatively of additionally to the guide rail or as exemplary embodiment of the guide rail, a housing of the carrier 110 can comprise, at the or each slot 116, a shaft or a compartment, which is configured to provide for a simpler or straight supply of the or of the respective module 130 to the respective slot 116 of the carrier 110.

The carrier 110 can have a back-wiring (also: backplane) for the pass-through to each of the slots 116 of one or several respective other line channels 118 of the control inteface 112.

On the one hand, the electrical connection and, on the other hand, the mechanical connection (at least with regard to the determination 124 of the degree of freedom 104) between slot 116 of the carrier 110 and, on the one hand of the first point 132 or, on the other hand, respectively, of the second point 134 of the module 130, are spatially separated. At least one of the two plug-in connector halves, which are used in the prior art according to the document EP 1 573 034 B1, can thus be forgone. For example, the mechanical connection and the electrical connection are realized at the same point of the module in the prior art according to document EP 1 573 034 B1. Due to the spatial separation of these functions, a more cost-efficient and/or more compact structural shape of the interface 116 is possible compared to the prior art.

Conductor tracks 136 or other contact means for the electrical connection are preferably arranged at a first edge of the first point 132 of the module 130, which have the mechanical degree of freedom 104, for example would be longitudinally movable as such. The determination 124 (or fixation 124) of the mechanical degree of freedom 104 (for example in a plane of the module 130 and perpendicular to the plug-in direction 102) is at a second edge of the second point 134 of the same module 130, which differs from the first edge or first point 132. For example, the first edge and the second edge or the first point 132 and the second point 134, respectively, are located oppositely at the module 130. Alternatively or additionally, the first edge and the second edge or the first point 132 and the second point 134, respectively, share a corner of the module 130 or of the module housing, meet at a corner of the module 130, or adjoin one another.

The slot 116 preferably comprises at least one first terminal contact 122.1, for example a spring contact 122.1, for the line channel 118, and at least one second terminal contact 122.2, for example a spring contact 122.2, for the I/O signal lines 120. At the first point 132, the module 130, as counter piece to the terminal contacts 122.1 and 122.2 (which are collectively referred to as terminal contacts 122) comprises only conductor tracks 136.1 or 136.2, respectively (which are collectively referred to as conductor tracks 136), for the respective line channel 118 or the respective I/O signal lines 120, for the electrical connection between the slot 116 and the first point 132 (i.e. for the contacting). In addition to the conductor tracks 136, a means for the electrical connection (i.e. for the contacting) is preferably not provided at the first point 132 of the module 130, for example no pad, no contact surface, or the like, but only ends of the conductor tracks 136.

A terminal at the control interface 112 can be connected one-to-one in an electrically conductive manner to a terminal contact 122.1 of the slot 116 for the pass-through of the signals. A grounding terminal of the control interface 112 is optionally connected in an electrically conductive manner to a separate grounding electrode 129.1 at the slot 116.

Alternatively or additionally, a terminal at the field interface 114 can be connected one-to-one in an electrically conductive manner to a terminal contact 122.2 of the slot 116 for the pass-through of the signals in each exemplary embodiment of the apparatus 100. A grounding terminal of the field interface 114 is optionally connected in an electrically conductive manner to a separate grounded electrode 129.2 at the slot 116.

Exemplary embodiments of the apparatus 100 can realize other features (for example individual features) of an exemplary embodiment described in the document EP 1 573 034 B1, such as, for example, the number of the terminal contacts 122 or the assignment of the terminal contacts 122, according to the document EP 1 573 034 B1.

On the control side, the line channels 118 can comprise a terminal 119 for the controller 150. On the field side, the signal lines 120 can comprise one or several terminals 121 for the field devices 160.

Figure 2:
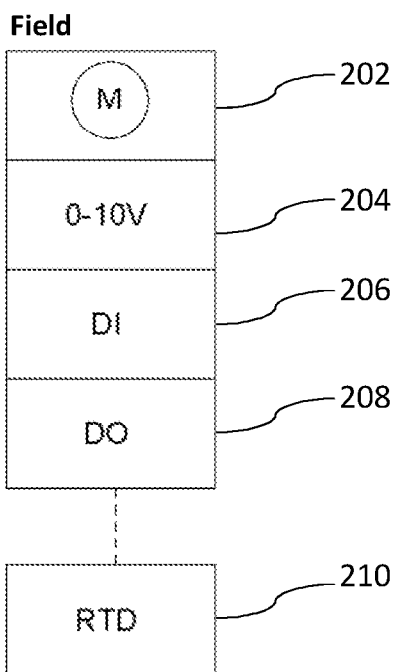
FIG. 2 shows a schematic assignment of a field interface, which can be realized or used in a second exemplary embodiment of the apparatus.

FIG. 2 shows a schematic assignment of the field interface 114, which can be realized or used in a second exemplary embodiment of the apparatus 100. The second exemplary embodiment can be a further development of the first exemplary embodiment.

The field interface 114 can comprise a terminal 202 for the grounding (in short: grounding terminal), which can preferably be used by the module 130 as functional grounding. Alternatively or additionally, the grounding terminal 202 can transmit a grounding potential from the controller 150 to the field devices 160, or vice versa. For example, the terminal 202 for grounding on the carrier 110 is connected to a grounding potential and/or a protective grounding and/or a mass terminal of the field device or devices 160.

Alternatively or additionally, the field interface 114 can comprise a positive pole 204 of a direct current supply of the field device 160 or of the field devices 160. For example, grounding terminal 202 and positive pole 204 can supply the field device 160 with electrical energy.

Alternatively or additionally, the field interface 114 can comprise a digital input 206 and/or a digital output 208. Alternatively or additionally, the field interface 114 comprises an analog input 210, for example for detecting a signal, which is applied as voltage signal or impedance, of a temperature sensor as field device 160.

Figure 3:
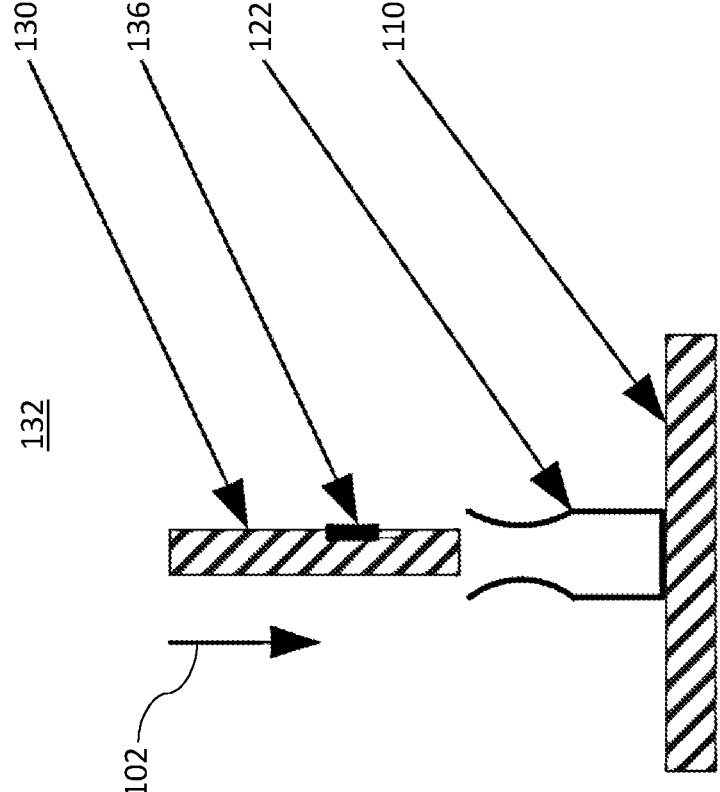
FIG. 3 shows a schematic sectional view of the electrical connection between slot and first point, which can be realized or used in a third exemplary embodiment of the apparatus.

FIG. 3 shows a schematic sectional view of the electrical connection between slot 116 and first point 132, which can be realized or used in a third exemplary embodiment of the apparatus 100. The third exemplary embodiment can be a further development of the first and/or of the second exemplary embodiment. For example, features of one of the exemplary embodiments provided with identical reference numerals can replace the corresponding feature in another exemplary embodiment.

At least individual ones of the or all terminal contacts 122 of the slot 116 of the carrier 110 are configured as two-sided spring contacts, preferably tulip contacts. The tulip contact 122 is configured to contact the conductor track 136 or one of the conductor tracks 136 of the module 130 at the first point 132, or each of the tulip contacts 122 is configured to contact a respective one of the conductor tracks 136 of the module 130 at the first point 132.

The tulip contact 122 comprises two spring contacts, which, in the mechanically connected state, abut between module 130 and slot 116 at the first point on opposite sides of the module 130 (for example at a board comprising the signal processing unit). The two spring contacts of a tulip contact 122 are in each case resilient and, in the mechanically connected state, are biased for abutting on the module 130. At least one of the two spring contacts contacts the respective conductor track 136, for example directly, galvanically, or metal on metal.

The two spring contacts of the or of each tulip contact 122 are aligned along the degree of freedom 104 (i.e. in the transverse direction, which is perpendicular to the image plane of FIG. 3). In the case of several tulip contacts 122, they can be in alignment along the degree of freedom 104 (i.e. in the transverse direction).

An electrical connection, which is more compact perpendicular to the plane of the module 130, is thus possible at the first point 132. Alternatively or additionally, the module 130 at the first point 132 can be flatter. Alternatively or additionally, the distances between the slots 116 on the carrier 110 can be smaller.

Figure 4:
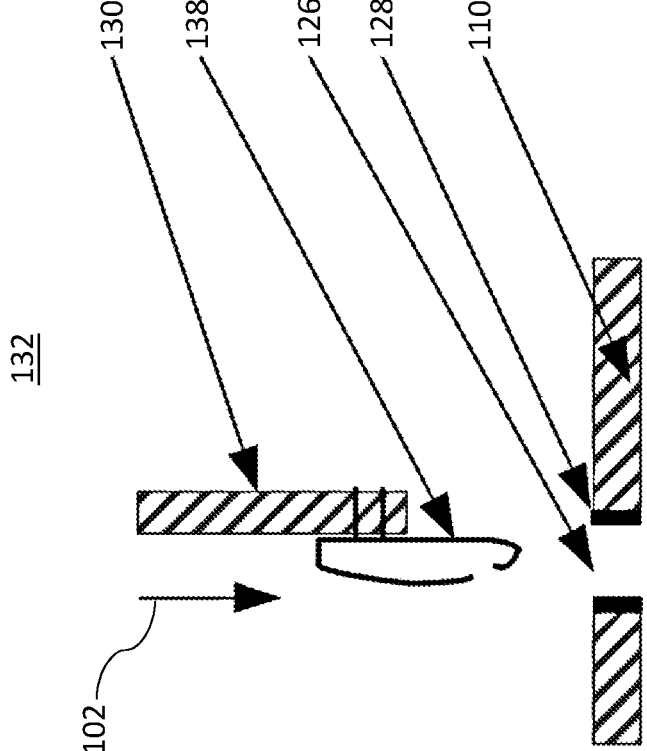
FIG. 4 shows a schematic sectional view of the electrical connection between a slot of the carrier and the first point of the module, which may be realized or used in a fourth exemplary embodiment of the apparatus.

FIG. 4 shows a schematic sectional view of the electrical connection between slot 116 and first point 132, which can be realized or used in a fourth exemplary embodiment of the apparatus 100. The fourth exemplary embodiment can be a further development of the first, second and/or of the third exemplary embodiment. Features of one of the exemplary embodiments, which are provided with identical reference numerals, can optionally replace the corresponding feature in another exemplary embodiment. For example, contact springs 138 at the first point 132 of the module 130 can partially or completely replace the conductor tracks 136 (for example the conductor tracks 136.1 and/or 136.2) at the first point 132 of the module 130. The terminal contacts described as spring contacts 122 (for example spring contacts for the line channel 122.1 and/or spring contacts 122.2 for the I/O signal lines) can be configured partially or completely as contact surfaces 128 at a circular hole or an oblong hole 126. Each contact surface 128 can be arranged circumferentially at a respective one of the circular holes or of the oblong holes 126.

For the electrical connection between carrier 110 and module 130, one or several contact springs 138 can be arranged at the first point 132 of the module. Each contact spring 138 is configured to engage with a circular hole or an oblong hole 126 in the carrier 110 (preferably in the mechanically connected state). In the mechanically connected state, each contact spring 138 abuts on the edge 128 of one of the oblong holes 126 for the electrically connection, for example directly, galvanically, or metal on metal.

The oblong hole 126 or the oblong holes 126 can be milled into the carrier in the longitudinal direction of the oblong hole. The circular hole or the circular holes can be drilled into the carrier. The edge 128 of each circular hole or oblong hole is preferably metal coated as contact surfaces 128.

Figure 5:
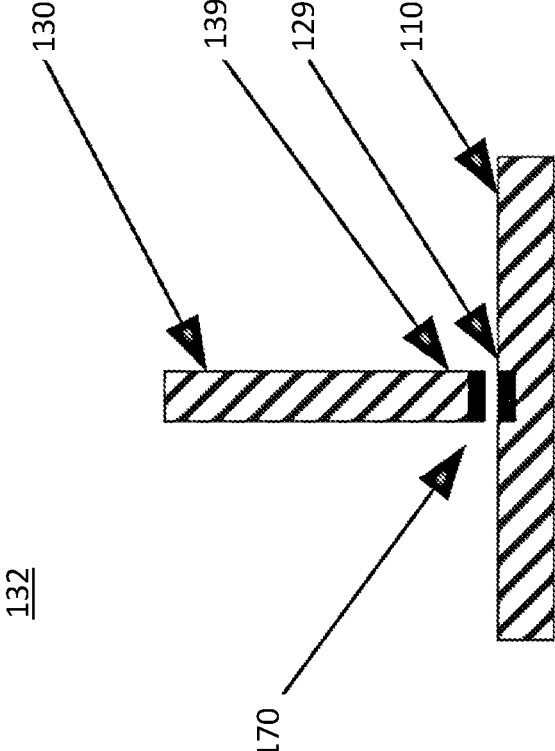
FIG. 5 shows a schematic sectional view of the functional grounding, which may be realized or used in a fifth exemplary embodiment of the apparatus.
Figure 6:
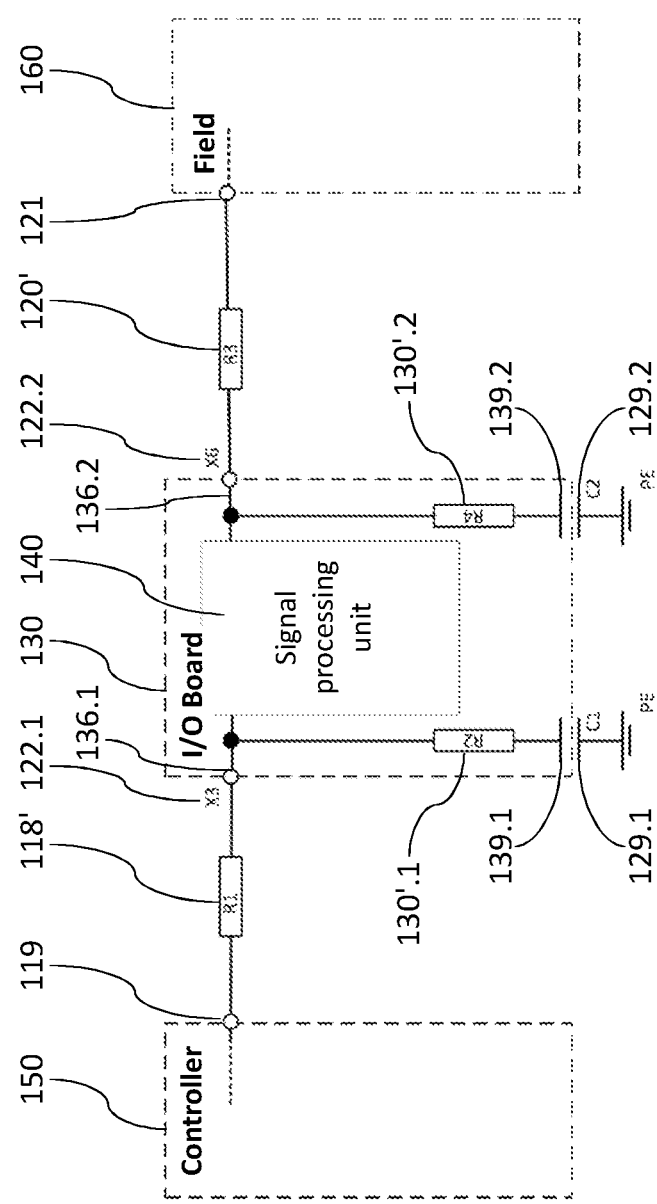
FIG. 6 shows a schematic block diagram of a sixth exemplary embodiment of the apparatus.

In a fifth exemplary embodiment, for example according to FIG. 1 and/or FIG. 5 and/or FIG. 6, a guide of a grounding (preferably of a functional grounding) or of a mass (preferably of a reference potential) comprises a capacitive coupling 170 or electrically conductive connection (for example a mainly ohmic coupling) between carrier 110 and module 130.

Without limiting the generality, reference is made below to the grounding. Instead of a grounding, any other ground potential or reference potential can be guided.

For example, the grounding is guided from the module 130 (preferably an I/O card) to the carrier 110 (preferably to the carrier board 111 of the carrier 110). The module 130 may comprise a sensitive electronics (for example the signal processing unit 140), which is arranged in a plastic housing, preferably for protection against environmental influences. The plastic housing commonly has the disadvantage that interferences, which are relevant for the electromagnetic compatibility (EMC) (for example interference signal acting on the module 130 and/or interference signals coming from the module 130) are guided via a plug-in contact because a discharge via the housing is not possible.

According to the fifth exemplary embodiment, the module 130 (for example the conductor plate of the module 130 carrying the signal processing unit) can abut on the carrier 110 (for example on the circuit board 111) or can abut one another in the mechanically connected state, optionally for the direct abutment of the respective grounding electrodes 129 and 139 (for example contact surfaces) on the slot 116 of the carrier 110 or on the module 130, respectively, or for the configuration of a predetermined distance between the grounding electrodes 129 and 139 (for example contact surfaces) at the slot 116 of the carrier 110 or at the module 130, respectively, for the capacitive coupling 170.

Due to the distance, a transition in the form of a capacitor is formed, i.e. the capacitive coupling 170. A capacitive coupling 170 is preferably in each case provided between the module 130 on the one side and the controller 150 or the field or field device 160, respectively, on the other side.

FIG. 6 shows a schematic block diagram of a sixth exemplary embodiment of the apparatus 100. Coupling capacitances of the capacitive coupling are identified with C1 and C2 in FIG. 6 with respect to the controller 150 or the field or field device 160, respectively.

In the case of interferences with steep flanks or interferences with a burst signal, the contact surfaces 129 and 139 do not even need to contact one another, but the capacitive coupling 170 to one another is sufficient.

Alternatively or additionally, each exemplary embodiment of the apparatus can comprise a circuit for discharging EMC interferences. The circuit can be configured to discharge EMC interferences (in short: interference discharge), which are coupled into the module 130 (for example the I/O card) from the field or field device 160.

For the interference discharge, the circuit can comprise a resistance 120' (R3) (preferably internal with respect to the carrier 110) between the electrical connection at the slot 116 and the field interface 114 and/or a resistance 130'.2 (R4) (preferably internal with respect to the module 130) between the terminal 136.2 or 138 and the grounding electrode 139.2 at the module 130. By means of the circuit, an EMC interference coupled in by the field or field device 160 can be discharged or guided to the grounding electrode 139.2 for discharging the interference, for example via the capacitive coupling 170 (i.e. the capacitor C2 in the case of FIG. 6) or the direct electrically conductive connection, to the grounded electrode 129.2 of the carrier 110.

Alternatively or additionally, the circuit for the interference discharge can comprise a resistance 118' (R1) (preferably internal with respect to the carrier 110) between the electrical connection at the slot 116 and the control interface 112 and/or a resistance 130'.1 (R2) (preferably internal with respect to the module 130) between the terminal 136.1 or 138 and the grounding electrode 139.1 at the module 130. An EMC interference coupled in by the controller 150 can be discharged or guided to the grounding electrode 139.1 by means of the circuit in order to discharge the interference, for example via the capacitive coupling 170 (i.e. the capacitor C1 in the case of FIG. 6) or the direct electrically conductive connection to the grounded electrode 129.1 of the carrier 110.

The coupled—in interference is then discharged to ground by the grounded electrode 129.1 or 192.2, respectively.

Alternatively, the apparatus 100 may comprise a common circuit for discharging interferences, which couple in from the controller 150 as well as from the field or field device 160.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

Apparatus 100
Plug-in direction 102
Degree of freedom in the transverse direction 104
Carrier 110

16

Conductor plate of the carrier, preferably with back-wiring 111
Control interface, preferably terminal clamp for controller 112
Carrier-side terminal of the line channels, preferably terminal clamp of the controller 113
Field interface, preferably terminal clamp for field devices 114
Carrier-side terminal of the I/O signal lines, preferably terminal clamps of the field or field device 115
Slot 116
Line channels (or wired channels) 118
Resistance, preferably line resistance R1 optionally of the line channels 118'
Control-side terminal of the line channels 119
I/O signal lines, in short: signal lines 120
Resistance, preferably line resistance R3, optionally of the signal lines 120'
Field-side terminal of the I/O signal lines 121
Terminal contact as spring contact of the slot of the carrier 122
Spring contacts for line channel, also: input contact 122.1
Spring contacts for I/O signal lines, also: output contact 122.2
Determination of the degree of freedom, preferably floating bearing, for example guide rail 124
Oblong hole in the carrier 126
Terminal contact as contact surface at the oblong hole 128
Grounding electrode or grounded electrode at the carrier, preferably tulip contact or contact surface 129
Grounding electrode at the carrier for the functional grounding of the controller 129.1
Grounding electrode at the carrier for the functional grounding of the field devices 129.2
Module, also: I/O card 130
Resistance, preferably discharge resistance R2 130'.1
Resistance, preferably discharge resistance R4 130'.2
First point of the module 132
Second point of the module 134
Conductor tracks of the module 136
Conductor tracks for line channel 136.1
Conductor tracks for I/O signal lines 136.2
Contact springs of the module 138
Electrode at the module for the functional grounding preferably contact surface 139
Electrode at the module for the functional grounding of the controller 139.1
Electrode at the module for the functional grounding of the field devices 139.2
Signal processing unit 140
Housing of the carrier 142
Recess for mounting rail, preferably comprising locking mechanism 144
Unlocking of the locking mechanism 146
Controller 150
Field device 160
Capacitive coupling, for example coupling capacitance C1 or C2 170
Functional ground, protective ground and/or grounding terminal of the field devices 202
Positive pole of a direct current supply of the field devices 204
Digital input 206
Digital output 208
Analog input, preferably for temperature sensor 210

The invention claimed is:

1. An apparatus for processing signals transmitted between a controller and one field device or multiple field devices, comprising:

a carrier, which comprises a control interface, a field interface, and one slot or multiple slots, the control interface being configured for connection of one electrical line channel or multiple electrical line channels of the controller, the field interface being configured for connection of input and/or output signal lines, I/O signal lines, of the one field device or the multiple field devices, and the one slot is, or each of the multiple slots are, configured for releasable mechanical connection of a module in a plug-in direction and, in the mechanically connected state, for the electrical connection of the respective module to the line channel or one of the line channels and to the I/O signal lines of the field device or one of the field devices; and at least one module, which is configured for the releasable mechanical connection to the carrier at the slot or one of the slots, and which is configured, in the mechanically connected state, to process signals from the electrically connected line channel and to output the signals at the electrically connected I/O signal lines and/or to process signals from the electrically connected I/O signal lines and to output the signals at the electrically connected line channel, wherein, in the mechanically connected state, the respective slot electrically connects the module at a first point of the module and, at the first point, has a mechanical degree of freedom transverse to the plug-in direction between module and carrier, and wherein the mechanical degree of freedom of the first point is determined by the mechanical connection of the slot at a second point of the module, which second point is different from the first point.

2. The apparatus of claim 1, wherein the first point of the module is spaced apart from the second point of the module.

3. The apparatus of claim 1, wherein a first edge of the module comprises the first point of the module.

4. The apparatus of claim 3, wherein the first edge of the module is perpendicular to the plug-in direction and/or parallel to the direction of the mechanical degree of freedom.

5. The apparatus of claim 3, wherein a second edge of the module, the second edge being different from the first edge, comprises the second point of the module.

6. The apparatus of claim 5, wherein the second edge of the module is parallel to the plug-in direction and/or perpendicular to the direction of the mechanical degree of freedom.

7. The apparatus of claim 1, wherein the first point of the module comprises conductor tracks.

8. The apparatus of claim 1, wherein at the first point, contact springs cantilever or protrude from the module in the plug-in direction.

9. The apparatus of claim 1, wherein for the electrical connection, the respective slot comprises circular holes arranged in a row parallel to the direction of the degree of freedom, or oblong holes arranged and aligned in a row parallel to the direction of the degree of freedom.

10. The apparatus of claim 1, wherein at the first point, at least one electrode is arranged at the module to capacitively couple with a functional grounding of the carrier in the mechanically connected state.

11. The apparatus of claim 1, wherein the respective slot comprises at least one grounded electrode, which is arranged to capacitively couple with the module in the mechanically connected state.

12. The apparatus of claim 1, wherein the module comprises:

a signal processing unit, which is configured to process the signals from the electrically connected line channel and to output them at the electrically connected I/O signal lines and/or to process the signals from the electrically connected I/O signal lines and to output them at the electrically connected line channel.

13. The apparatus of claim 1, wherein the control interface of the carrier comprises a plug-in connector half, which is configured for the connection of the electrical line channel or channels of the controller, and/or wherein the field interface comprises a plug-in connector half for the connection of the signal lines of the field device or devices.

14. The apparatus of claim 1, wherein the carrier is configured for pass-through of different line channels of the controller at different slots.

15. The apparatus of claim 1, wherein the carrier is configured for the pass-through of a respective one of the line channels of the controller at each of the slots.

16. The apparatus of claim 1, wherein the carrier is configured for the pass-through of the line channels to the respective module without an own signal processing and/or with a linear signal response.

17. The apparatus of claim 1, wherein at least two slots of the carrier are configured to mechanically connect and/or to release at least two modules independently of one another to the carrier.

18. The apparatus of claim 1, further comprising:

an apparatus housing, in which the carrier is arranged, wherein the module is, or the modules are, arranged or arrangeable in the apparatus housing when connected to the carrier.

19. The apparatus of claim 3, wherein the first edge of the module comprises an edge of the module leading in the plug-in direction.

20. An apparatus for processing signals transmitted between a controller and one field device or multiple field devices, comprising:

a carrier, which comprises a control interface, a field interface, and one slot or multiple slots, the control interface being configured for connection of one electrical line channel or multiple electrical line channels of the controller, the field interface being configured for connection of input and/or output signal lines, I/O signal lines, of the one field device or the multiple field devices, and the one slot is, or each of the multiple slots are, configured for releasable mechanical connection of a module in a plug-in direction and, in the mechanically connected state, for the electrical connection of the respective module to the line channel or one of the line channels and to the I/O signal lines of the field device or one of the field devices; and at least one module, which is configured for the releasable mechanical connection to the carrier at the slot or one of the slots, and which is configured, in the mechanically connected state, to process signals from the electrically connected line channel and to output the signals at the electrically connected I/O signal lines and/or to process signals from the electrically connected I/O signal lines and to output the signals at the electrically connected line channel, wherein, in the mechanically connected state, the respective slot electrically connects the module at a first point of the module and, at the first point, has a mechanical degree of freedom transverse to the plug-in direction between module and carrier, wherein the mechanical degree of freedom of the first point is determined by the mechanical connection of the slot at a second point of the module, which second point is different from the first point, and wherein for the electrical connection, the respective slot comprises spring contacts arranged in a row parallel to a direction of the mechanical degree of freedom.

* * * * *